United States Patent
Li

(10) Patent No.: US 10,157,653 B1
(45) Date of Patent: Dec. 18, 2018

(54) VERTICAL SELECTOR FOR THREE-DIMENSIONAL MEMORY WITH PLANAR MEMORY CELLS

(71) Applicant: SanDisk Technologies LLC, Plano, TX (US)

(72) Inventor: Shaoping Li, San Ramon, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/627,175

(22) Filed: Jun. 19, 2017

(51) Int. Cl.
  G11C 11/00 (2006.01)
  G11C 11/16 (2006.01)
  G11C 11/063 (2006.01)

(52) U.S. Cl.
  CPC ........ G11C 11/161 (2013.01); G11C 11/1673 (2013.01); G11C 11/1675 (2013.01); G11C 11/063 (2013.01)

(58) Field of Classification Search
  CPC ... G11C 11/161; G11C 11/1673; G11C 16/75; G11C 11/06035; G11C 11/06057; G11C 11/063
  USPC .................. 365/151, 148, 158, 173, 51, 130
  See application file for complete search history.

(56) References Cited

U.S. PATENT DOCUMENTS

| | | | |
|---|---|---|---|
| 8,766,234 B1 | 7/2014 | Hashim et al. | |
| 8,873,271 B2 | 10/2014 | Lam et al. | |
| 8,923,050 B2 | 12/2014 | Cernea et al. | |
| 9,252,362 B2 | 2/2016 | Pio | |
| 9,425,237 B2 | 8/2016 | Jo | |
| 9,461,094 B2 | 10/2016 | Li et al. | |
| 9,502,349 B2 | 11/2016 | Chen | |
| 2005/0226041 A1* | 10/2005 | Nejad | B82Y 10/00 365/158 |
| 2008/0175032 A1* | 7/2008 | Tanaka | G11C 5/025 365/51 |
| 2011/0266604 A1 | 11/2011 | Kim et al. | |
| 2015/0325290 A1* | 11/2015 | Lasser | G11C 13/0069 365/148 |
| 2016/0005464 A1* | 1/2016 | Hu | G11C 13/0069 365/148 |
| 2016/0233333 A1 | 8/2016 | Toh et al. | |

OTHER PUBLICATIONS

Johnson, Colin R., "IBM, Samsung Put New Spin on MRAM", EE Times, Jul. 7, 2016.

(Continued)

*Primary Examiner* — Tan T. Nguyen
(74) *Attorney, Agent, or Firm* — Kunzler, PC

(57) ABSTRACT

Apparatuses, systems, and methods are disclosed for non-volatile memory. A plurality of layers of planar non-volatile memory cells forms a three-dimensional memory array. A plurality of word lines are coupled to planar non-volatile memory cells. Word lines may extend horizontally across layers of memory cells. A plurality of selector columns are coupled to planar non-volatile memory cells. Selector columns extend vertically through layers of memory cells, and may include central conductors surrounded by one or more concentric selective layers. One or more selective layers may permit an electrical current through a cell, between a word line and a central conductor, in response to a voltage satisfying a threshold.

20 Claims, 7 Drawing Sheets

(56) References Cited

OTHER PUBLICATIONS

Bae, Yoon Cheol et al., "All oxide semiconductor-based bidirectional vertical p-n-p selectors for 3D stackable crossbar-array electronics", Nature.com/scientificreports, Aug. 20, 2015.
Zhao, Weisheng et al., "High Density Spin-Transfer Torque (STT)-MRAM based on Cross-Point Architecture", http://www.ief.u-psud.fr/~zhao/papers/2012/IMWSTTMRAM.pdf, 2012, Paris, France.
Mandapati, R. et al., "On Pairing of Bipolar RRAM Memory with NPN Selector Based on Set/Reset Array Power Considerations", IEEE Transactions of Nanotechnology, vol. 12, No. 6, Nov. 2013.

* cited by examiner

US 10,157,653 B1

VERTICAL SELECTOR FOR THREE-DIMENSIONAL MEMORY WITH PLANAR MEMORY CELLS

TECHNICAL FIELD

The present disclosure, in various embodiments, relates to non-volatile memory and more particularly relates to a selector for non-volatile memory.

BACKGROUND

Various types of memory devices store data in two-dimensional or three-dimensional arrays of memory cells. Physical and/or electrical properties of the memory cells may be altered to write data, and sensed to read data. For example, in a two-dimensional array where word lines are coupled to rows of cells and bit lines are coupled to columns of cells, reading data from a cell may involve applying a read voltage to a word line, and sensing a current or voltage at a bit line, to determine the state of a cell. However, a bit line voltage or current may also be affected by "sneak current" through other cells in the array. Sneak current may disturb data in neighboring cells during a write operation, reduce the reliability of read operations, and increase the overall power consumption (and heat generation) of a memory device. Accordingly, certain memory devices may include switching or selection components such as transistors, Zener diodes, or the like, which limit leakage current through unselected cells. For a three-dimensional array, however, providing selection components for multiple layers of memory cells may significantly increase the time and cost of fabrication.

SUMMARY

Apparatuses are presented for non-volatile memory. In one embodiment, a plurality of layers of planar non-volatile memory cells forms a three-dimensional memory array. In a certain embodiment, a plurality of word lines are coupled to planar non-volatile memory cells. In a further embodiment, word lines extend horizontally across layers of memory cells. In one embodiment, a plurality of selector columns are coupled to planar non-volatile memory cells. In a certain embodiment, selector columns extend vertically through layers of memory cells. In a further embodiment, selector columns include central conductors surrounded by one or more concentric selective layers. In certain embodiments, one or more selective layers may permit an electrical current through a cell, between a word line and a central conductor, in response to a voltage satisfying a threshold.

Systems are presented for non-volatile memory. A system, in one embodiment, includes a non-volatile memory element. In one embodiment, a non-volatile memory element includes a plurality of layers of planar magnetic tunnel junctions. In a further embodiment, magnetic tunnel junctions may be memory cells of a three-dimensional non-volatile memory array. In a certain embodiment, a non-volatile memory element includes a plurality of word lines coupled to memory cells. In a further embodiment, word lines extend horizontally across layers of magnetic tunnel junctions. In one embodiment, a non-volatile memory element includes a plurality of selector pillars coupled to memory cells. In a certain embodiment, selector pillars extend vertically through layers of magnetic tunnel junctions. In a further embodiment, selector pillars include vertical metal connections and one or more vertical selective layers. In certain embodiments, one or more selective layers may limit an electrical current through a cell, between a word line and a vertical metal connection, in response to a voltage failing to satisfy a threshold. In one embodiment, a non-volatile memory element includes a plurality of bit lines coupled to selector pillars. In a further embodiment, a non-volatile memory element includes a controller that performs read operations and write operations by controlling word line and bit line voltages.

An apparatus, in another embodiment, includes means for storing data in a three-dimensional array of planar magnetoresistive memory cells. In a certain embodiment, an apparatus includes means for coupling word line voltages to memory cells. In a further embodiment, an apparatus includes means for selectively permitting electrical current through memory cells. In certain embodiments means for selectively permitting electrical current may extend vertically through multiple layers of a means for storing data.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
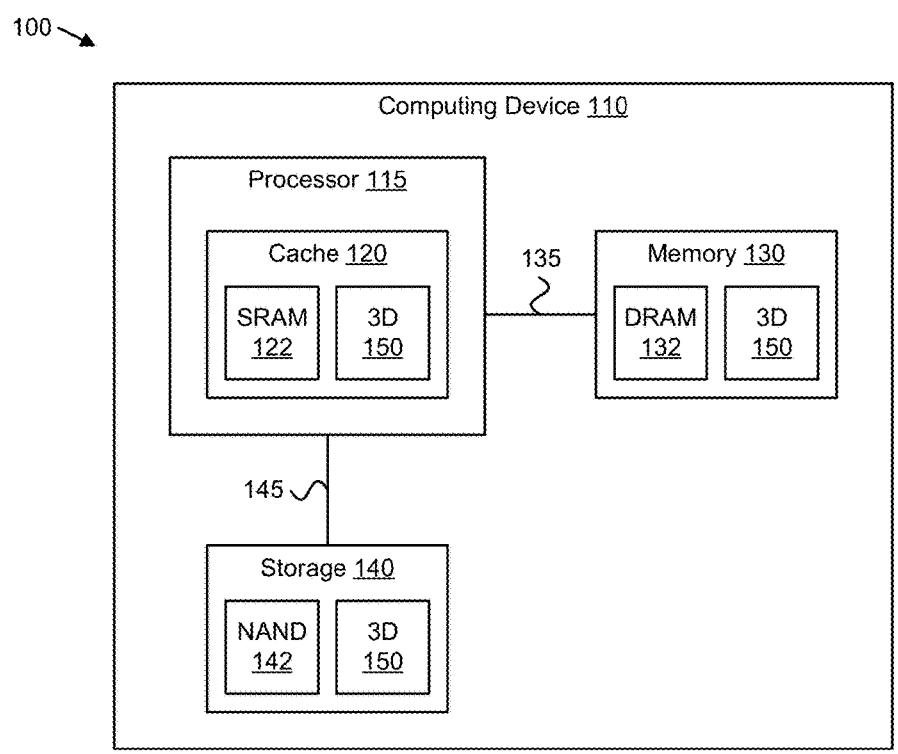
FIG. 1 is a schematic block diagram of one embodiment of a system comprising three-dimensional memory.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 depicts a system 100 comprising three-dimensional memory 150. In the depicted embodiment, the system includes a computing device 110. In various embodiments, a computing device 110 may refer to any electronic device capable computing by performing arithmetic or logical operations on electronic data. For example, a computing device 110 may be a server, a workstation, a desktop computer, a laptop computer, a tablet, a smartphone, a control system for another electronic device, a network attached storage device, a block device on a storage area network, a router, a network switch, or the like. In certain embodiments, a computing device 110 may include a non-transitory, computer readable storage medium that stores computer readable instructions configured to cause the computing device 110 to perform steps of one or more of the methods disclosed herein.

In the depicted embodiment, the computing device 110 includes a processor 115, a memory 130, and storage 140. In various embodiments, a processor 115 may refer to any electronic element that carries out the arithmetic or logical operations performed by the computing device. For example, in one embodiment, the processor 115 may be a general-purpose processor that executes stored program code. In another embodiment, a processor 115 may be a field-programmable gate array (FPGA), an application-specific integrated circuit (ASIC), or the like, that operates on data stored by the memory 130 and/or the storage 140. In a certain embodiment, a processor 115 may be a controller for a storage device (e.g., on a storage area network) a networking device, or the like.

In the depicted embodiment, the processor 115 includes a cache 120. In various embodiments, a cache 120 may store data for use by the processor 115. In certain embodiments, a cache 120 may be smaller and faster than the memory 130, and may duplicate data in frequently-used locations of the memory 130, or the like. In certain embodiments, a processor 115 may include a plurality of caches 120. In various embodiments, a cache 120 may include one or more types of memory media for storing data, such as static random access memory (SRAM) 122, three-dimensional memory 150, or the like. For example, in one embodiment, a cache 120 may include SRAM 122. In another embodiment, a cache 120 may include three-dimensional memory 150. In a certain embodiment, a cache 120 may include a combination of SRAM 122, three-dimensional memory 150, and/or other memory media types.

The memory 130, in one embodiment, is coupled to the processor 115 by a memory bus 135. In certain embodiments, the memory 130 may store data that is directly addressable by the processor 115. In various embodiments, a memory 130 may include one or more types of memory media for storing data, such as dynamic random access memory (DRAM) 132, three-dimensional memory 150, or the like. For example, in one embodiment, a memory 130 may include DRAM 132. In another embodiment, a memory 130 may include three-dimensional memory 150. In a certain embodiment, a memory 130 may include a combination of DRAM 132, three-dimensional memory 150, and/or other memory media types.

The storage 140, in one embodiment, is coupled to the processor 115 by a storage bus 145. In certain embodiments, the storage bus 145 may be a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In various embodiments, the storage 140 may store data that is not directly addressable by the processor 115, but that may be accessed via one or more storage controllers. In certain embodiments, the storage 140 may be larger than the memory 130. In various embodiments, a storage 140 may include one or more types of storage media for storing data, such as a hard disk drive, NAND flash memory 142, three-dimensional memory 150, or the like. For example, in one embodiment, a storage 140 may include NAND flash memory 142. In another embodiment, a storage 140 may include three-dimensional memory 150. In a certain embodiment, a storage 140 may include a combination of NAND flash memory 142, three-dimensional memory 150, and/or other storage media types.

In various embodiments, three-dimensional memory 150 may be used to store data in a cache 120, memory 130, storage 140, and/or another component that stores data. For example, in the depicted embodiment, the computing device 110 includes three-dimensional memory 150 in the cache 120, memory 130, and storage 140. In another embodiment, a computing device 110 may use three-dimensional memory 150 for memory 130, and may use other types of memory or storage media for cache 120 or storage 140. Conversely, in another embodiment, a computing device 110 may use three-dimensional memory 150 for storage 140, and may use other types of memory media for cache 120 and memory 130. Additionally, some types of computing device 110 may include memory 130 without storage 140 (e.g., in a microcontroller) if the memory 130 is non-volatile, may include memory 130 without a cache 120 for specialized processors 115, or the like. Various combinations of cache 120, memory 130, and/or storage 140, and uses of three-dimensional memory 150 for cache 120, memory 130, storage 140, and/or other applications will be clear in view of this disclosure.

In various embodiments, the three-dimensional memory 150 may include one or more chips, packages, die, or other integrated circuit devices comprising three-dimensional memory arrays with multiple layers of memory cells, disposed on one or more printed circuit boards, storage housings, and/or other mechanical and/or electrical support structures. For example, one or more dual inline memory modules (DIMMs), one or more expansion cards and/or daughter cards, a solid-state-drive (SSD) or other storage device, and/or another memory and/or storage form factor may comprise the three-dimensional memory 150. The three-dimensional memory 150 may be integrated with and/or mounted on a motherboard of the computing device 110, installed in a port and/or slot of the computing device 110, installed on a different computing device 110 and/or a dedicated storage appliance on a network, in communication with a computing device 110 over an external bus, or the like.

The three-dimensional memory 150, in various embodiments, may include one or more memory die. A memory die may include multiple layers of memory cells in a three-dimensional memory array. In various embodiments, three-dimensional memory may include magnetoresistive RAM (MRAM), phase change memory (PCM), resistive RAM (ReRAM), NOR Flash memory, NAND Flash memory, Silicon-Oxide-Nitride-Oxide-Silicon (SONOS) memory, or the like. Various types of three-dimensional memory 150 for use with a computing device 110 will be clear in view of this disclosure.

In certain embodiments, the three-dimensional memory 150 main include a plurality of planar memory cells forming a three-dimensional array, a plurality of word lines extending horizontally across the layers (e.g., in-plane), and a plurality of selector columns or pillars extending vertically through the plurality of layers. In further embodiments, the selector columns or pillars may be coupled to the memory cells, and may include central conductors surrounded by one or more concentric selective layers. In various embodiments, one or more selective layers may permit an electrical current through a cell, between a word line and a central conductor, in response to a voltage satisfying a threshold. In certain embodiments, a selector column or pillar that extends through a plurality of layers of planar memory cells may facilitate reading to or writing from individual memory cells by limiting leakage current through other cells. Additionally, in further embodiments, forming a selector pillar or column that extends through a plurality of layers may simplify manufacturing compared to forming selector devices in individual layers alternating with memory cell layers. Three-dimensional memory 150 including selector columns or pillars is described in further detail below with regard to FIGS. 2 through 9.

Figure 2:
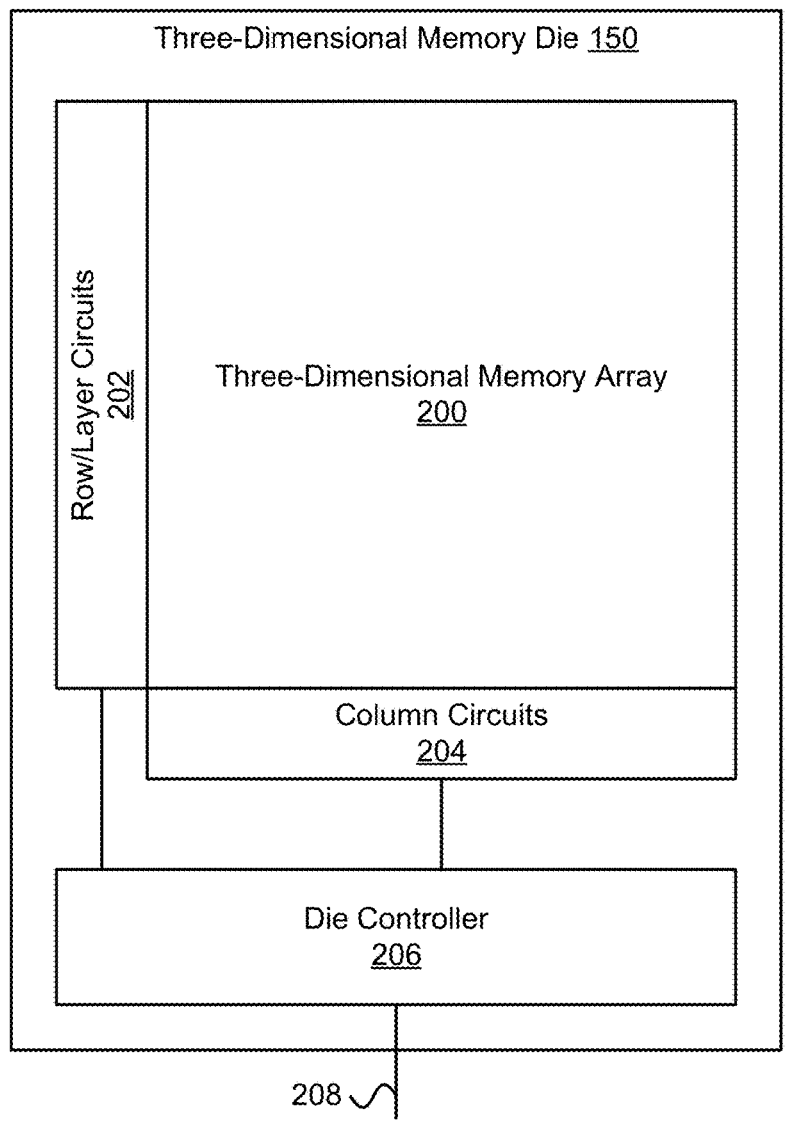
FIG. 2 is a schematic block diagram illustrating one embodiment of a three-dimensional memory die.

FIG. 2 depicts one embodiment of a three-dimensional memory die 150. The three-dimensional memory die 150 may be substantially similar to the three-dimensional memory 150 described with reference to FIG. 1. The three-dimensional memory die 150, in the depicted embodiment, includes a three-dimensional memory array 200 including multiple layers of memory cells, row/layer circuits 202, column circuits 204, and a die controller 206.

In various embodiments, a three-dimensional memory die 150 may refer to an integrated circuit that includes both a core array 200 of memory cells for data storage, and peripheral components (e.g., row/layer circuits 202, column circuits 204, and/or die controller 206) for communicating with the array 200. In certain embodiments, one or more three-dimensional memory die 150 may be included in a memory module, a storage device, or the like.

In the depicted embodiment, the three-dimensional memory array 200 includes a plurality of planar memory cells. In one embodiment, the array 200 may include multiple planes and/or layers of memory cells. In various embodiments, the array 200 may be addressable by layers and/or rows within layers via row/layer circuits 202 (e.g., by controlling word lines, select lines, or the like), and by columns via column circuits 204 (e.g., by controlling bit lines.).

The die controller 206, in certain embodiments, cooperates with the row/layer circuits 202 and the column circuits 204 to perform memory operations on the array 200. In various embodiments, the die controller 206 may include components such as a power control circuit that controls the power and voltages supplied to the row/layer circuits 202 and column circuits 204 during memory operations, an address decoder that translates a received address to a hardware address used by the row/layer circuits 202 and column circuits 204, a state machine that implements and controls the memory operations, and the like. The die controller 206 may communicate with a computing device 110, a processor 115, a bus controller, a storage device controller, a memory module controller, or the like, via line 208, to receive command and address information, transfer data, or the like.

Figure 3:
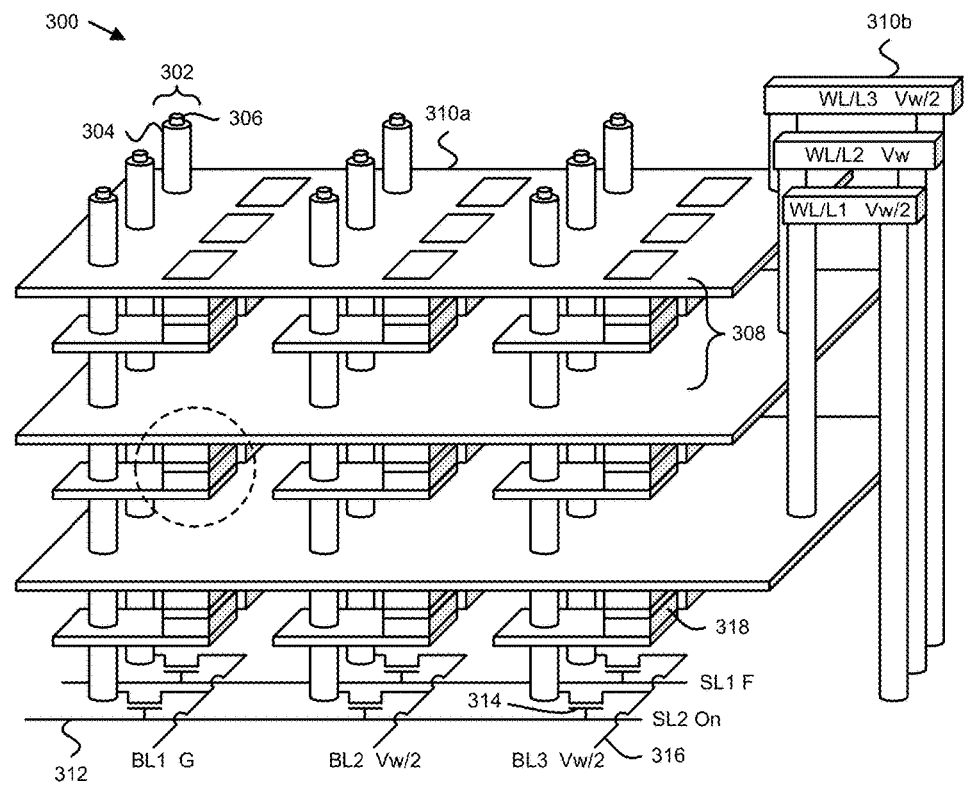
FIG. 3 is a perspective view illustrating one embodiment of a three dimensional memory array.
Figure 4:
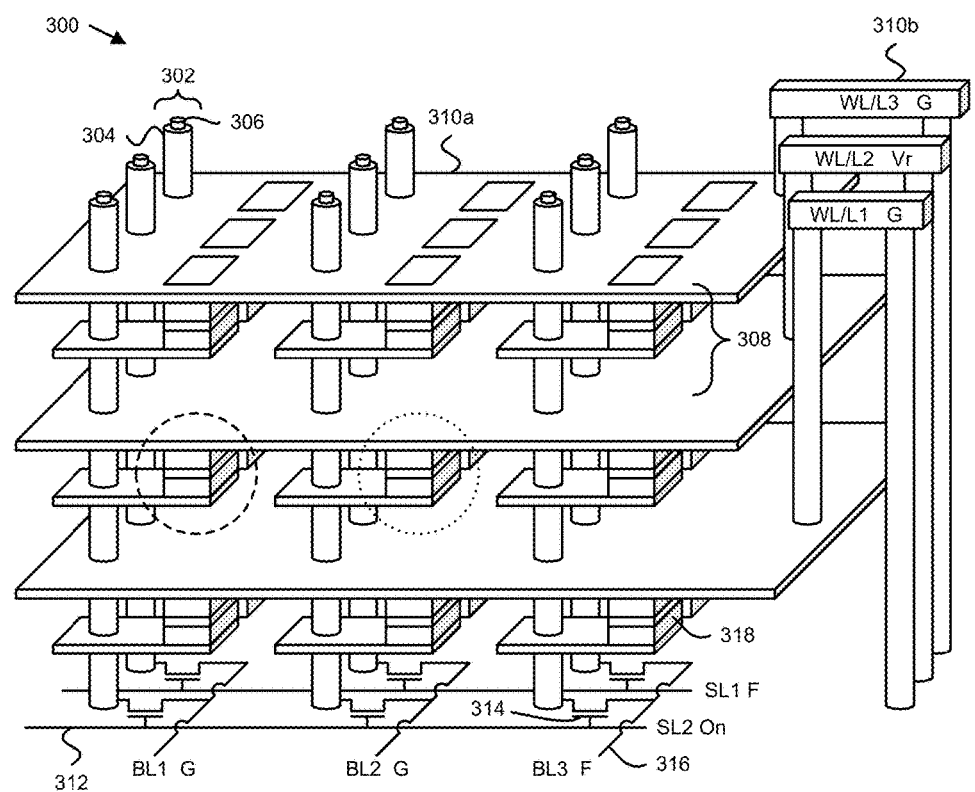
FIG. 4 is a perspective view illustrating a further embodiment of a three dimensional memory array.

FIGS. 3 and 4 depict one embodiment of a three-dimensional memory array 300 during write (FIG. 3) and read (FIG. 4) operations. In certain embodiments, the three-dimensional memory array 300 may be substantially similar to the three-dimensional memory array 200 described above with reference to FIG. 2. In the depicted embodiment, the three-dimensional array 300 includes selector columns 302, layers 308 of memory cells 318, word lines 310, select lines 312, select transistors 314, and bit lines 316.

In various embodiments, a three-dimensional memory array 300 is formed by a plurality of layers 308 of memory cells 318. In various embodiments, a memory cell 318 may be any component with a physical property that is alterable to store data. For example, a memory cell 318 for NAND memory may be a floating gate transistor, for which the threshold voltage (corresponding to an amount of stored charge on the floating gate) may be altered to store data. Similarly, a memory cell 318 for magnetoresistive memory may be a magnetic tunnel junction, for which a resistance (corresponding to whether two magnetic layers are in parallel or antiparallel states) may be altered to store data. Various types of memory cells 318 for various types of non-volatile memory, such as ReRAM, PCM, MRAM, NAND, and the like, will be clear in view of this disclosure.

In certain embodiments, the memory cells 318 may be planar non-volatile memory cells 318. As used herein, a "planar" memory cell 318 may refer to any memory cell 318 that stores data using one or more substantially flat layers parallel to a substrate. For, example, for NAND memory that stores data based on charge trapped in a floating gate, a planar memory cell 318 may include a flat, horizontal floating gate or charge trap region. Conversely, a memory cell based on a vertical or high-aspect-ratio structure, such as a memory hole formed through a plurality of horizontal layers, or a FinFET, would not be a planar memory cell 318.

In the depicted embodiment, the planar memory cells 318 are magnetic tunnel junctions. A magnetic tunnel junction (MTJ) may include "fixed" and "free" magnetic layers, where a magnetic moment of the free layer may be switched to be parallel or antiparallel to a magnetic moment of the fixed layer. A thin dielectric or barrier layer may separate the fixed and free layers, and current may flow across the barrier layer due to quantum tunneling. A difference in resistance between parallel and antiparallel states allows data to be stored. For example, a low resistance may correspond to a binary "1" and a high resistance may correspond to a binary "0," Alternatively, a low resistance may correspond to a binary "0" and a high resistance may correspond to a binary "1." Thus, MTJs are magnetoresistive memory cells. In certain embodiments, MTJs may be planar, and may store data using flat, horizontal magnetic layers separated by a flat barrier layer. Forming MTJs using planar, layer-by-layer techniques may allow manufacturers to provide very thin barrier layers (e.g., 10 Å or thinner) to facilitate quantum tunneling while still blocking other current. By contrast, attempting to form curved or vertical MTJs may result in barrier layer flaws that produce low resistance in both parallel and antiparallel states.

In certain embodiments, the memory cells 318 may be two-terminal resistive memory cells 318. In various embodiments, resistive memory cells 318 with two terminals may use the same current path between terminal for writing (e.g., changing a resistance), and for reading (e.g., sensing a resistance). In one embodiment, a two-terminal resistive memory cells 318 may be a spin-transfer torque (STT) MTJ, where data is written by passing a spin-polarized electrical current through the cell 318, to change the magnetic moment of the free layer. The direction of the current may determine the magnetization of the free layer. In another embodiment, a two-terminal resistive memory cell 318 may be a PCM memory cell 318, a ReRAM memory cell 318, or the like. In certain embodiments, two-terminal memory cells 318 may facilitate forming dense three-dimensional memory arrays (e.g., compared to cells with a third terminal, in which additional connections use more space). In certain embodiments, bidirectional selection devices may be configured to permit current to flow in either direction for writing to a two-terminal memory cell 318, and may limit leakage current through unselected cells 318.

In certain embodiments, a layer 308 of memory cells 318 may comprise a two-dimensional array or grid of memory cells 318, so that a three-dimensional memory array 300 is formed by a plurality of layers 308. In certain embodiments, layers 308 of memory cells 318 may alternate with dielectric or oxide layers to prevent shorts between layers 308. FIGS. 3 and 4 depict a simplified embodiment of a three-dimensional memory array 300, including three layers 308 and nine memory cells 318 per layer 308. However, in another embodiment, a three-dimensional memory array 300 may include many more layers 308 and/or many more memory cells 318. Various structures such as dielectric layers are also omitted from the figures for convenience in depicting the layers 308 and memory cells 318. Additionally, sizes of various layers and components in FIGS. 3-9 may not be depicted to scale, as the figures illustrate relations between components rather than the relative size of each component.

In the depicted embodiment, a plurality of word lines 310 are coupled to the memory cells 318. In various embodiments, a word line 310 may be a conductor (or set of connected conductors) that is connected to a plurality of memory cells 318. In certain embodiments, a die controller 206 may use a word line 310 to address a plane or layer 308 of memory cells 318, or a subset of a layer 308, such as a row, a set of rows, a portion of a row, or another set of memory cells 318 within a layer 308. Using a word line 310 to address a set of cells 318 may include setting a word line voltage to a read voltage, a write voltage, or the like.

In various embodiments, the row/layer circuits 202 may be coupled to a word line 310. In certain embodiments, a word line 310 may include a first conductor 310a that connects directly to terminals of the memory cells 318, and one or more further conductors 310b that couple the first conductor 310a to a voltage source such as a switch transistor, a voltage bus, or the like.

In the depicted embodiment, the word lines 310 extend horizontally across the layers 308 of memory cells 318. As used herein, terms such as "horizontal," "vertical" and the like refer to an orientation relative to a substrate for a three-dimensional memory array 300. Thus, the arrows indicating x, y, and z directions in FIG. 3 and FIG. 4 show the x and y directions (e.g., parallel to the layers 308) as horizontal, and the z direction (e.g., perpendicular to the layers 308) as vertical. Accordingly, a word line 310 may be referred to as extending in a horizontal direction, relative to a substrate, regardless of the orientation of the substrate itself relative to an external object. Furthermore, a word line 310 may be referred to as extending horizontally "across" a layer 308 based on crossing the array 300 parallel to the layer 308, rather than on crossing or penetrating through the layer 308.

In one embodiment, a word line 310 may extend horizontally across a layer 308 of memory cells 318 by extending within the layer 308. For example, in one embodiment, upper terminals of two-terminal memory cells 318 may occupy a sublayer, and a word line 310 may be coupled to the upper terminals in that sublayer. In another embodiment, a word line 310 may extend horizontally across a layer 308 of memory cells 318 by extending parallel to the layer 308. For example, in one embodiment, a layer comprising one or more word lines 310 may be formed above a layer 308 of memory cells 318, and a metal interconnect layer may provide connections between the one or more word lines 310 and the memory cells 318.

In certain embodiments, a word line 310 addresses a layer 308 of memory cells 318. For example, in the depicted embodiment, a word line 310 includes a conductor 310a that is connected to the memory cells 318 of a layer 308, and one word line 310 is provided per layer 308 of memory cells 318. In another embodiment, a word line 310 may address a subset of memory cells 318 of a layer 308. For example, in one embodiment, multiple word lines 310 may be provided per layer 308 so that each word line 310 is connected to a row of memory cells 318. In certain embodiments, additional circuitry such as switch transistors may be provided to control word line voltages.

In the depicted embodiment, a plurality of selector columns 302 are coupled to the memory cells 318, and extend vertically through the layers 308 (e.g., in the z direction, or along an axis with a component in the z direction). In certain embodiments, a selector column 302 includes a central conductor 306, and one or more selective layers 304. In one embodiment, the central conductor 306 is surrounded by one or more concentric selective layers 304. In various embodiments, the central conductor 306 may be metal, polysilicon, or any other electrically conductive material. In certain embodiments, a selector column 302 may include more than one conductor 306. The one or more selective layers 304, in certain embodiments, may permit an electrical current through a cell 318, between a word line 310 and a central conductor 306, in response to a voltage satisfying a threshold. Conversely, in various embodiments, the one or more selective layers 304 may limit an electrical current through a cell 318, between a word line 310 and a central conductor 306, in response to a voltage failing to satisfy a threshold.

In various embodiments, terms relating to current through a selective layer 304, such as "permitting" and "limiting," "on" and "off" or the like, may be relative terms so that a "permitted" current is significantly higher than a "limited" current. However, a small leakage current may flow when the selector column 302 or selective layers 304 are in the "off" or current-limiting state, and a nonzero resistance may occur when the selector column 302 or selective layers 304 are in the "on" or current-permitting state. For example, a p-n junction diode may be said to be "on" or "permitting" an electrical current when a forward bias voltage exceeds the built-in potential difference of the junction and the slope of the current/voltage curve is high, and may be said to be "off"

or "limiting" an electrical current when the forward bias voltage does not exceed the built-in potential difference of the junction and the slope of the current/voltage curve is low, or when a reverse bias voltage (of lower magnitude than a breakdown voltage) does not allow significant current to flow. However, some leakage current may occur when the diode is off. Similarly, a selector column 302 or selective layer(s) 304 may be referred to as "limiting" rather than "permitting" an electrical current even when a small leakage current exists.

In various embodiments, a "threshold" for a voltage may be any voltage that defines, delineates, or corresponds to a boundary between current-limiting and current-permitting states for a selector column 302 or selective layer(s) 304. An applied voltage across selective layer(s) 304 may be referred to as satisfying the threshold if the selective layer(s) 304 permit a current, and as failing to satisfy the threshold if the selective layer(s) 304 limit a current. In certain embodiments, a selector column 302 may permit bidirectional currents (e.g., current in one direction for writing a binary zero to a memory cell 318 and in an opposite direction for writing a binary one), and bipolar selective layer(s) 304 may have positive and negative voltage thresholds, so that the selective layer(s) 304 permit a current in one direction if a positive applied voltage satisfies the positive voltage threshold, and permit a current in the other direction if a negative applied voltage satisfies the negative voltage threshold. In a further embodiment, bipolar selective layer(s) 304 may limit a current for a range of applied voltages between the positive and negative thresholds.

The one or more selective layers 304 may include various types of selective material that permit or limit current at different voltages as an inherent characteristic of the material (e.g., for a single selective layer 304) and/or as a characteristic of an interface between materials (e.g., for multiple selective layers 304). For example, in one embodiment, a selector column 302 may include a layer of ovonic threshold switching (OTS) material, which permits or limits current based on a phase change, as a single selective layer 304. In another embodiment, a selector column 302 may include alternating layers of n-type and p-type material (e.g., n-p-n, or p-n-p) as selective layers 304, so that the selective layers 304 permit a current if a voltage across the forward-biased p-n junction exceeds the built-in potential and a voltage across the reverse-biased p-n junction exceeds the Zener voltage for quantum tunneling, avalanche breakdown, or the like. In certain embodiments, n-type and p-type material may include doped silicon, poly-silicon, oxide semiconductors, or the like. Various suitable selective layers 304, such as insulators for metal-insulator-metal selectors, transition metal oxides such as vanadium oxide or niobium oxide for metal-insulator transition selectors, mixed ionic-electronic conduction composites, or the like, will be clear in view of this disclosure.

In general, in various embodiments, a first terminal of a two-terminal memory cell 318 may be coupled to a horizontal word line 310, and a second terminal of the two-terminal memory cell 318 may be coupled to a vertical selector column 302. For example, in the depicted embodiments, the memory cells 318 are STT-MTJs formed as stacks of horizontal layers, where an upper terminal connects to a word line 310 and a lower terminal connects to a selector column 302. Accordingly, if a voltage between the word line 310 and the central conductor 306 satisfies a threshold, the selector column 302 may permit an electrical current through the cell 318, for reading or writing data to the cell 318. Conversely, if the voltage between the word line 310 and the central conductor 306 fails to satisfy a threshold, the selector column 302 may limit an electrical current through the cell 318, so that leakage current through the cell 318 does not significantly affect a read or write operation for another cell 318

In certain embodiments, the selective layer(s) 304 may provide a high on-off ratio (e.g., a ratio of currents between the current-permitting and current-limiting states). For example, an on-off ratio may be 10^7, or greater. In certain embodiments, a high on-off ratio may provide high read currents and/or write currents for selected cells 318, with low leakage currents.

In some embodiments, selective layer(s) 304 may permit current through a physical region where a voltage difference exceeds a threshold, but limit current in another region. For example, n-p-n or p-n-p silicon layers may permit current in a physical region where a breakdown occurs, but not in another region, so that one selector column 302 may permit current through one cell 318, but not through another cell 318. Accordingly, a selector column 302 may provide independent current selection for individual cells 318 coupled to the selector column 302, in a one-selector/one-cell ratio. By contrast, other array architectures that provide a one-selector/N-cell ratio (for N>1) may encounter increased problems relating to leakage currents.

In certain embodiments, the selector columns 302 may be formed by forming vertical holes through the plurality of layers 308 (e.g., by masking and etching), depositing one or more selective layers 304 in the vertical holes, and depositing metal or other conductive material for a central conductor 306 in the remaining space. In certain embodiments, memory cell layers 308 may be formed at one fabrication facility, and selective layers 304 may be formed at another fabrication facility. For example, in one embodiment, layers of magnetic material and barrier layers for planar MTJs may be formed at a back end of line (BEOL) fabrication facility, and n-p-n selective layers 304 may be formed at a front end of line (FEOL) fabrication facility. Forming planar n-p-n selectors for each layer of MTJs would therefore involve repeated transfers between BEOL and FEOL facilities. By contrast, providing vertical selector columns 302 may allow a manufacturer to form multiple layers 308 of memory cells 318 at one facility, and subsequently transfer the array 300 to another facility to form the selector columns 302.

In an alternative embodiment, selector pillars may be coupled to the memory cells 318, and extend vertically through the layers 308 (e.g., in the z direction, or along an axis with a component in the z direction). In certain embodiments, a selector pillar may include one or more vertical metal connections and one or more vertical selective layers. In one embodiment, a selector pillar may include a central metal connection and one or more concentric selective layers, which may be substantially similar to the central conductor 306, and one or more selective layers 304 of a selector column 302. In another embodiment, however, a selector pillar may include vertical selective material that is disposed in electrical contact with the vertical conductor without concentrically surrounding the vertical conductor.

Bit lines 316, in one embodiment, are coupled to the selector columns 302 or pillars for reading or writing data to the cells 318. In various embodiments, a word line 310 may address a layer 308, row, or other plurality of cells 318, and bit lines 316 may be conductors that address individual cells 318 within that layer 308, row, or other plurality of cells 318. (Bit lines 316 may also address cells 318 in other layers 308 or rows, coupled to other word lines 310). Using a bit line 316 to address a cell 318 may include setting a bit line voltage or current to write data to the cell 318, sensing a bit line voltage or current to read data from the cell 318, or the like. In certain embodiments, a bit line 316 may be coupled to multiple selector columns 302 via select transistors 314, and the select transistors 314 may permit or limit current between individual selector columns 302 and the bit line 316. In certain embodiments, the conductor 306 for a selector column 302 may act as a local bit line, so that a selected cell 318 is at the intersection of a word line 310 and a selector column 302, and the bit lines 316 may act as "global" bit lines for accessing the local bit lines or selector columns 302.

In certain embodiments, select lines 312 are coupled to control gates of the select transistors 314 so that activating a select line 312 activates one select transistor 314 per bit line 316. Activating a select line 312 and a select transistor 314 may refer to applying a control gate voltage that permits current between drain and source terminals, applying a base current that permits current between collector and emitter terminals, or otherwise controlling the select transistor 314 via the select line 312 to permit current between a selector column 302 and a bit line 316. For example, in the depicted embodiment, the bit lines 316 extend in the y direction, and the select lines 312 extend in the x direction. so that activating a select line 312 (by applying an "on" voltage) activates select transistors 314 in the x direction, but not in the y direction.

In various embodiments, a controller such as the die controller 206 of FIG. 2 may control word line voltages and bit line voltages to perform read operations and write operations. FIG. 3 depicts a write operation for a selected cell 318 (indicated by a dashed line). As used herein, a "selected" cell 318 may refer to a cell 318 from which data is read in a read operation, or to which data is written in a write operation. Correspondingly, a word line 310 for the selected cell 318 or a bit line 316 for the selected cell 318 may be referred to as a "selected" word line 310 or bit line 316.

For a write operation, a controller 206 may couple a write voltage $V_W$ to the selected word line 310, and ground the selected bit line 316. For example, in the depicted embodiment, a word line 310 for layer 2 (WL/L2) addresses the selected cell 318, and a first bit line 316 (e.g., BL1) addresses the selected cell 318, so the BL1 voltage is set to 0 or ground, and the WL/L2 voltage is set to $V_W$. The controller 206 couples half the write voltage (e.g., $V_W/2$) to other, unselected word lines 310 and bit lines 316. The controller 206 turns one select line 312 (e.g., SL2) on. Other select lines 312 may be grounded by the controller 206 or may float (e.g., may not be coupled to an external voltage).

Where select lines 312 are grounded or floating, select transistors 314 are off, and voltage at a central conductor 306 for a selector column 302 is also floating. However, where the select line 312 is on and the select transistors 314 are activated, the bit line voltages are coupled to central conductors 306 of the selector columns 302. At the selected cell 318, the voltage difference between the selected bit line 316 and the selected word line 310 (e.g., the write voltage $V_W$) satisfies the threshold for the selector column 302, and a current passes through the selected cell 318 for writing data to the selected cell 318. By contrast, the voltage between a word line 310 and a selector column 302 for half-selected cells 318 (e.g., coupled to the selected word line 310 or the selected bit line 316 but not both) is half the write voltage (e.g., $V_W/2$), and the voltage for unselected cells 318 (e.g., coupled to an unselected word line 310 and an unselected bit line 316) is zero. Half the write voltage (or a zero voltage) may fail to satisfy a voltage threshold for a selector column 302, so that current is limited through unselected cells 318.

FIG. 4 depicts a read operation for a selected cell 318 (indicated by a heavy dashed line). For a read operation, a controller 206 may couple a read voltage VR to the selected word line 310, and may ground other word lines 310. The controller 206 grounds a group or set of bit lines 316 including a bit line 316 for the selected cell 318. For example, in the depicted embodiment, a first bit line 316 (e.g., BL1) is grounded for the selected cell 318, and a second bit line 316 (e.g., BL2) is grounded for a cell 318 (indicated by a light dashed line) adjacent to the selected cell 318. The controller 206 detects the state (e.g., resistance) of the selected cell 318 by monitoring a current at the selected bit line 316. Other bit lines 316 outside the group of grounded bit lines 316 may be allowed to float. As in FIG. 3, the controller 206 turns one select line 312 (e.g., SL2) on. Other select lines 312 may be grounded by the controller 206 or may float.

Where select lines 312 are grounded or floating, select transistors 314 are off, and voltage at a central conductor 306 for a selector column 302 is also floating. However, where the select line 312 is on and the select transistors 314 are activated, the bit line voltages are coupled to central conductors 306 of the selector columns 302. At the intersection of the grounded bit lines 316 and the selected word line 310, the read voltage VR satisfies the threshold for the selector column 302, and a current passes through cells 318 including the selected cell 318, for reading data from the selected cell 318. The read current may be smaller than the write current due to current-limiting resistors, smaller read voltages, or the like, so that the current for reading a cell 318 does not rewrite erroneous data to a cell 318.

In certain embodiments, grounding a group of bit lines 316 for a read operation may reduce the effect of sneak current at the selected bit line 316. In various embodiments, a "sneak current" may refer to any portion or component of a current between a selected word line 310 and a selected bit line 316 other than the current through the selected cell 318. For example, a sneak current may pass from a selected word line 310 through a first unselected cell 318 to a conductor 306 of a selector column 302, through a second unselected cell 318 to an unselected word line 310, and through a third unselected cell 318 to the selected bit line 316. Sneak current for resistive memory may be variable depending on whether unselected cells 318 on potential sneak current paths are in high-resistance or low-resistance states, and may result in writing to unselected cells 318, or in read errors where a bit line current is affected by unselected cells 318.

The selector columns 302 may reduce sneak current by limiting current in response to voltages that fail to satisfy a threshold. However, floating selector column voltages (e.g., where select lines 312 are floating and select transistors 314 are off, or where bit lines 316 are floating) may permit some sneak current. Thus, in certain embodiments, grounding a plurality of bit lines 316 for a read operation may allow sneak current from floating selector columns 302 to primarily pass through grounded bit lines 316 other than the selected bit line 316, so that the current at the selected bit line 316 accurately reflects the state of the selected cell 318. For example, in one embodiment, the group of bit lines 316 grounded by the controller 206 for a read operation may include the selected bit line 316 and adjacent bit lines 316 on either side of the selected bit line 316, so that sneak current involving floating bit lines 316 is more likely to pass through the adjacent grounded bit lines 316 and less likely to pass through the selected bit line 316. In a further embodiment, an array 300 may include multiple word lines 310 per layer 308, so that sneak current is reduced by reducing the number of unselected cells 318 coupled to the selected word line 310. Arrays including multiple word lines 310 per layer 308 are described in further detail below with reference to FIGS. 6-8.

Figure 5:
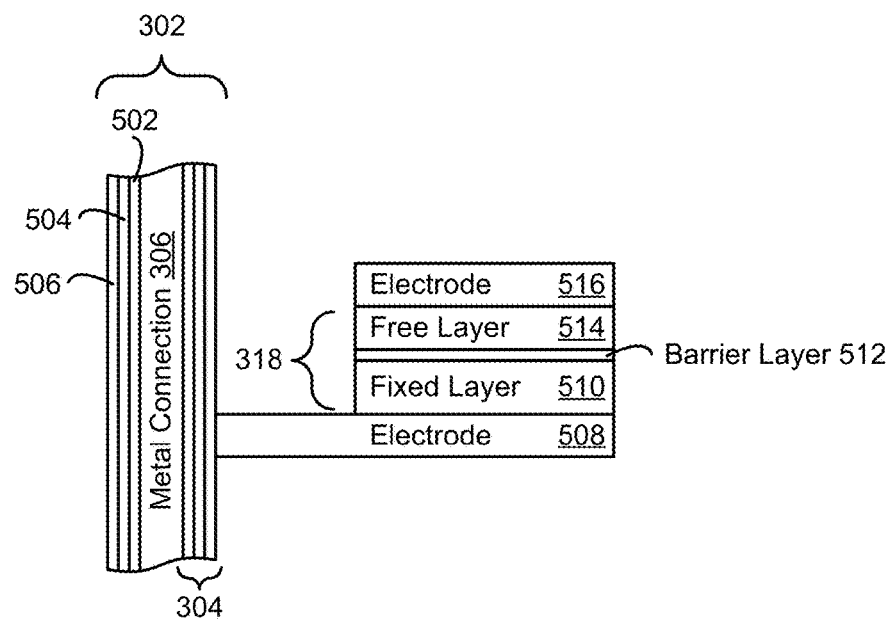
FIG. 5 is a cross section view illustrating a planar non-volatile memory cell and a selector column, in one embodiment.

FIG. 5 depicts a planar non-volatile memory cell 318 and a selector column 302, in one embodiment. In certain embodiments, the memory cell 318 and a selector column 302 may be substantially as described above with regard to FIG. 3 and FIG. 4.

In the depicted embodiment, the planar non-volatile memory cell 318 is an STT MTJ including a fixed layer 510, a barrier layer 512, and a free layer 514. A top electrode 516 is disposed above the free layer 514, and a bottom electrode 508 is disposed below the fixed layer 510. In another embodiment, the MTJ may be inverted so that the free layer 514 is adjacent to the bottom electrode 508 and the fixed layer 510 is adjacent to the top electrode 516. In various embodiments, the fixed layer 510 may have a fixed magnetic moment, and the free layer 514 may have a variable magnetic moment, so that tunneling current through the dielectric barrier layer 512 is affected by whether the magnetic moment of the free layer 514 is parallel or antiparallel to the magnetic moment of the fixed layer 510. In certain embodiments, an MTJ may include further layers or structures that are not depicted in FIG. 5, such as a pinning layer to fix the magnetic moment of the fixed layer 510, a capping layer that affects the magnetic anisotropy of the free layer 514, dielectric material surrounding the MTJ, a metal connection between a word line 310 and the top electrode 516, or the like. In another embodiment, a planar non-volatile memory cell 318 may be a type of memory cell 318 other than an MTJ, such as a PCM memory cell 318 or the like, but may similarly be formed as a stack of horizontal layers.

In one embodiment, the selector column 302 includes a central metal connection 306, and a plurality of selective layers 304, which may be substantially as described above with regard to FIG. 3 and FIG. 4. In the depicted embodiment, the selective layers 304 include a first layer of p-type silicon 502, a layer of n-type silicon 504, and a second layer of p-type silicon 506. Thus, the selective layers 304 form a series-connected p-n-p selector. In another embodiment, selective layers 304 may include a p-type silicon layer between two n-type silicon layers to form a series-connected n-p-n selector.

In various embodiments, the top electrode 516 is connected to a word line 310, the bottom electrode 508 is connected to the outside of the selector column 302, and the central metal connection 306 for the selector column 302 is coupled to a bit line 316. (In another embodiment, the orientation may be reversed so that the electrode 516 that connects to a word line 310 is below the electrode 508 that connects to a selector column 302.) Thus, the selector column 302 will permit a current through the cell 318 if a voltage difference between a word line 310 and a bit line 316 (after any drop across the cell 318) satisfies a threshold for the selective layers 304. For a read operation, the resistance of the cell 318, corresponding to whether the magnetic moments of the fixed layer 510 and the free layer 514 are parallel or antiparallel, may then be sensed by detecting the bit line current. At higher currents, the resistance of the cell 318 may be altered for a write operation, due to spin-polarization of the current by the fixed layer 510, and resulting torque on the magnetic moment of the free layer 514. However, if the voltage difference between a word line 310 and a bit line 316 does not satisfy the threshold for the selective layers 304, the selector column 302 will not permit a current through the cell 318.

In certain embodiments, additional cells 318 may be coupled to the selector column 302, in higher or lower layers 308 of cells 318, or in the same layer 308 but at a different side of the selector column 302. For example, the cell 318 depicted in FIG. 5 is at the right side of the selector column 302, and an additional cell 318 may be disposed at the left side of the selector column 302. In certain embodiments, the selective layers 304 may permit a current in one region, and limit a current in another region. For example, p-n-p selective layers 304 include one forward biased junction and one reverse biased junction, regardless of the direction of the applied voltage, and the reverse biased junction may permit current in a physical location where tunneling or avalanche breakdown occurs, while still limiting current at another physical location. Thus, the selector column 302 may permit or limit current independently for multiple cells 318.

Figure 6:
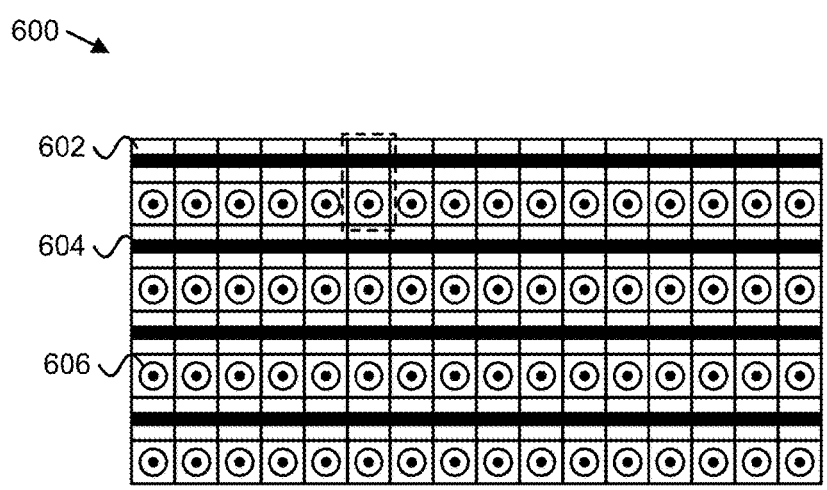
FIG. 6 is a top view illustrating one embodiment of a three dimensional memory array.
Figure 7:
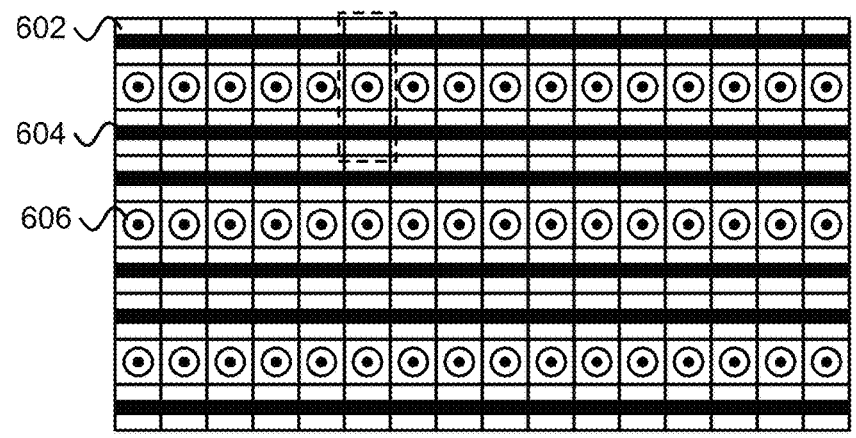
FIG. 7 is a top view illustrating another embodiment of a three dimensional memory array.
Figure 8:
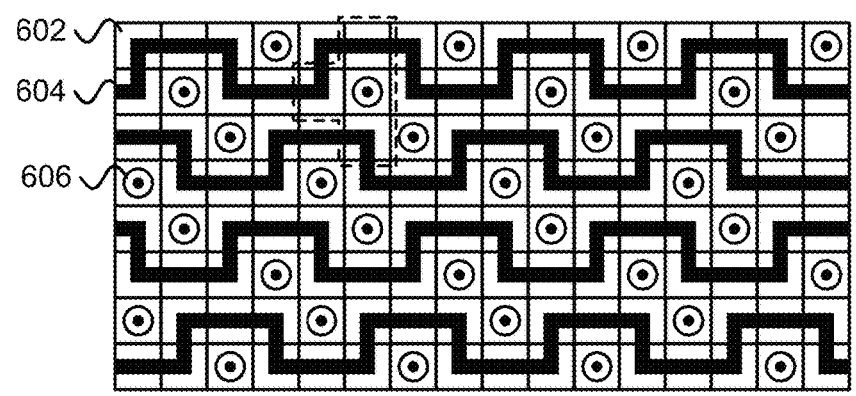
FIG. 8 is a top view illustrating another embodiment of a three dimensional memory array.

FIGS. 6, 7, and 8 are top views of three-dimensional memory arrays 600, 700, 800 in different embodiments, which may be substantially similar to the array 300 described above with reference to FIGS. 3 and 4. In the depicted embodiment, the arrays 600, 700, 800 include memory cells 602, word lines 604, and selector pillars 606, which may be substantially similar to the memory cells 318, word lines 310 and selector columns 302 or pillars described above with above with reference to FIGS. 3 and 4. A top layer of memory cells 602 and word lines 604 is shown, and the depicted selector pillars 606 extend vertically (e.g., into the page) through multiple similar layers.

In one embodiment, as depicted in FIGS. 3 and 4, a layer 308 of memory cells 318 is addressed by one word line 310. In another embodiment, as depicted in FIGS. 6, 7, and 8, a layer of memory cells 602 may be addressed by multiple word lines 604. In one embodiment, as depicted in FIG. 6, a layer of memory cells 602 of the array 600 includes one memory cell 602 per selector pillar 606. A dashed line indicates a repeated unit of the array 600, where the repeated unit includes one memory cell 602 and one selector pillar 606. In the depicted embodiment, a row of memory cells 602 is coupled to a word line 604, and to a row of selector pillars 606. In a further embodiment, separate word lines 604 are provided for separate rows of memory cells 602. In certain embodiments, providing multiple word lines 604 per layer of an array 600, such as a word line 604 for each row of memory cells 602, may reduce sneak current (compared to providing one word line 604 per layer) by reducing the number of cells 602 coupled to a selected word line 604.

In another embodiment, as depicted in FIGS. 7 and 8, a layer of memory cells 602 may include two or more memory cells 602 per selector pillar 606, addressed by two or more word lines 604. For example, in one embodiment, as depicted in FIG. 7, a layer of memory cells 602 of the array 700 includes two memory cells 602 per selector pillar 606. As in FIG. 6, a dashed line indicates a repeated unit of the array 700. In the depicted embodiment in FIG. 7, the repeated unit includes two memory cells 602 and one selector pillar 606. In one embodiment, two rows of memory cells 602 are coupled to two word lines 604, and to one row of selector pillars 606. In certain embodiments, two memory cells 602 coupled to one selector pillar 606 may be independently selected for read or write operations based on which word line 604 a read voltage or a write voltage is applied to. In various embodiments, providing two or more memory cells 602 per selector pillar 606 in a layer of an array 700 may increase memory capacity for the array 700, compared to a one cell 602 per pillar 606 architecture.

In another embodiment, as depicted in FIG. 8, a layer of memory cells 602 of the array 800 includes two memory cells 602 per selector pillar 606. As in FIG. 6 and FIG. 7, a dashed line indicates a repeated unit of the array 800. In the depicted embodiment in FIG. 8, the repeated unit includes three memory cells 602 and one selector pillar 606. In certain embodiments, word lines 604 may be routed around selector pillars 606 to connect to memory cells 602, and may therefore extend across the layer of the array 800 in a serpentine manner, instead of along a straight row. In some embodiments, two or more cells 602 connected to one selector pillar 606 may be addressed by the same word line 604. In further embodiments, such cells 602 may be independently addressed by separate vertical metal conductors of the selector pillar 606, coupled to separate select transistors.

Figure 9:
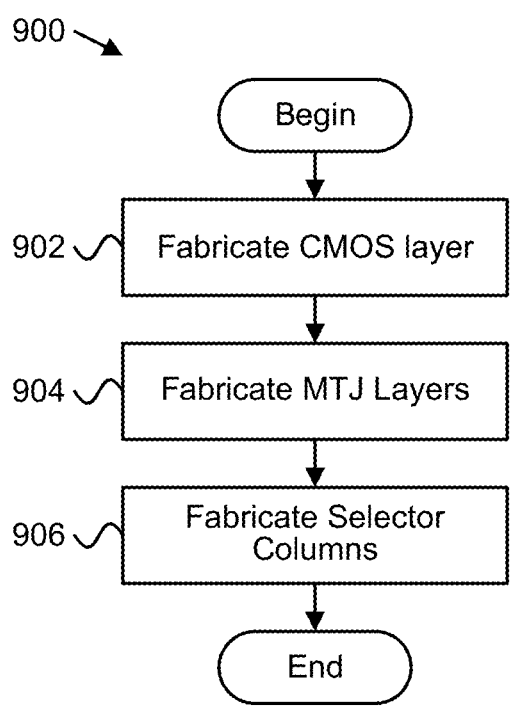
FIG. 9 is a schematic flow chart diagram illustrating one embodiment of a method for making a three dimensional memory array.

FIG. 9 depicts one embodiment of a method 900 for making a three dimensional memory array 300. In the depicted embodiment, the method begins 900, and a manufacturer fabricates 902 a complementary metal oxide semiconductor (CMOS) layer. In various embodiments, a CMOS layer may include select transistors 314, for coupling bit lines 316 to selector columns 302, switch transistors for coupling word lines 310 to a voltage bus, or the like. A manufacturer fabricates 904 a plurality of layers 308 of magnetic tunnel junctions (or other planar memory cells 318). The manufacturer then fabricates 906 a plurality of selector columns 302, and the method 900 ends.

In certain embodiments, fabricating 906 the selector columns 302 after fabricating 904 the memory cell layers 308 may involve transferring the array 300 from a BEOL fabrication facility to a FEOL fabrication facility, but may avoid repeated transfers that would be involved in forming separate selector layers for each memory cell layer 308. Furthermore, in certain embodiments, the CMOS layer may be fabricated 902 at the FEOL fabrication facility. In further embodiments, the CMOS layer may be fabricated 902 at the end of the method 900 instead of at the beginning of the method 900 (e.g., on top of the array 300 instead of under the array 300), so that the number of transfers between FEOL and BEOL facilities is reduced to one.

A means for storing data in a three-dimensional array 300 of planar magnetoresistive memory cells, in various embodiments, may include a plurality of memory magnetoresistive memory cells 318 (e.g., MTJs), a plurality of layers 308 of memory cells 318, or the like. Other embodiments may include similar or equivalent means for three-dimensional array 300.

A means for coupling word line voltages to memory cells 318, in various embodiments, may include an electrode 516, a word line 310, a word line switch transistor, a voltage bus, row/layer circuits 202, a decoder and/or voltage level shifter that produces word line voltages, or the like. Other embodiments may include similar or equivalent means for coupling word line voltages to memory cells 318.

A means for selectively permitting electrical current through memory cells 318, in various embodiments, may include a selector column 302, a selector pillar 606, one or more selective layers 304, a layer of OTS material, alternating layers of p-type and n-type material, or the like. Other embodiments may include similar or equivalent means for selectively permitting electrical current.

A means for controlling word line voltages, in various embodiments, may include a die controller 206, row/layer circuits 202, a decoder and/or voltage level shifter that produces word line voltages, or the like. Other embodiments may include similar or equivalent means for controlling word line voltages.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a plurality of layers of planar non-volatile memory cells forming a three-dimensional memory array;
   a plurality of word lines coupled to the planar non-volatile memory cells, the word lines extending horizontally across the plurality of layers; and
   a plurality of selector columns coupled to the planar non-volatile memory cells, the selector columns extending vertically through the plurality of layers, the selector columns comprising central conductors surrounded by a set of at least one concentric selective layers, wherein the set of at least one concentric selective layers permits an electrical current through a cell, between a word line and a central conductor, in response to a voltage satisfying a threshold.

2. The apparatus of claim 1, wherein the planar non-volatile memory cells comprise magnetic tunnel junctions.

3. The apparatus of claim 1, wherein the planar non-volatile memory cells comprise two-terminal resistive memory cells.

4. The apparatus of claim 1, wherein the set of at least one concentric selective layers comprises alternating layers of n-type and p-type material.

5. The apparatus of claim 1, further comprising a plurality of select transistors and a plurality of bit lines, the select transistors coupling the selector columns to the bit lines such that multiple selector columns are coupled to one bit line.

6. The apparatus of claim 5, further comprising a plurality of select lines coupled to control gates of the select transistors such that activating a select line activates one select transistor per bit line.

7. The apparatus of claim 1, wherein a word line addresses a layer of memory cells.

8. The apparatus of claim 1, wherein a layer of memory cells comprises one memory cell per selector column.

9. The apparatus of claim 1, wherein a layer of memory cells comprises two or more memory cells per selector column, addressed by two or more word lines.

10. The apparatus of claim 1, wherein the selector columns are formed after forming the plurality of layers.

11. A system comprising:
    a non-volatile memory element, the non-volatile memory element comprising
       a plurality of layers of planar magnetic tunnel junctions comprising memory cells of a three-dimensional non-volatile memory array;
       a plurality of word lines coupled to the memory cells, the word lines extending horizontally across the plurality of layers;
       a plurality of selector pillars coupled to the memory cells, the selector pillars extending vertically through the plurality of layers, the selector pillars comprising vertical metal connections and a set of at least one vertical selective layers, wherein the set of at least one vertical selective layers limits an electrical current through a cell, between a word line and a vertical metal connection, in response to a voltage failing to satisfy a threshold;

a plurality of bit lines coupled to the selector pillars; and a controller that performs read operations and write operations by controlling word line and bit line voltages.

12. The system of claim 11, wherein the controller performs a read operation for a selected memory cell by coupling a read voltage to a word line for the selected cell, grounding other word lines, and grounding a group of bit lines including a bit line for the selected cell, to detect a resistance of the selected cell.

13. The system of claim 11, wherein the controller performs a write operation for a selected memory cell by coupling a write voltage to a word line for the selected cell, grounding a bit line for the selected cell, and coupling half the write voltage to other word lines and bit lines.

14. The system of claim 11, wherein the non-volatile memory element further comprises a plurality of select transistors coupling the selector pillars to the bit lines such that multiple selector pillars are coupled to one bit line.

15. The system of claim 14, wherein the non-volatile memory element further comprises comprising a plurality of select lines coupled to control gates of the select transistors such that activating a select line activates one select transistor per bit line.

16. The system of claim 11, wherein the set of at least one vertical selective layers comprises alternating layers of n-type and p-type material.

17. The system of claim 11, wherein a layer of magnetic tunnel junctions comprises one magnetic tunnel junction per selector pillar.

18. The system of claim 11, wherein a layer of magnetic tunnel junctions comprises two or more magnetic tunnel junctions per selector pillar, addressed by two or more word lines.

19. An apparatus comprising:
means for storing data in a three-dimensional array of planar magnetoresistive memory cells;
means for coupling word line voltages to the memory cells; and
means for selectively permitting electrical current through the memory cells, wherein the means for selectively permitting electrical current comprises a set of at least one vertical selective layers extending vertically through multiple layers of the means for storing data, and is configured to permit an electrical current through a memory cell of the means for storing data in response to a voltage satisfying a threshold.

20. The apparatus of claim 19, further comprising means for controlling the word line voltages.

* * * * *